United States Patent
Mi et al.

(10) Patent No.: US 10,872,549 B2
(45) Date of Patent: Dec. 22, 2020

(54) GATE DRIVING CIRCUIT, SHIFT REGISTER AND DRIVING CONTROL METHOD THEREOF

(71) Applicants: Beijing BOE Optoelectronics Technology Co., Ltd., Beijing (CN); BOE Technology Group Co., Ltd., Beijing (CN)

(72) Inventors: Lei Mi, Beijing (CN); Yanna Xue, Beijing (CN); Zhiying Bao, Beijing (CN); Yong Zhang, Beijing (CN); Lu Bai, Beijing (CN); Jingpeng Wang, Beijing (CN); Gang Hua, Beijing (CN); Haobo Fang, Beijing (CN); Lingxiang Yuan, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 42 days.

(21) Appl. No.: 16/332,944

(22) PCT Filed: Aug. 10, 2018

(86) PCT No.: PCT/CN2018/099941
§ 371 (c)(1),
(2) Date: Mar. 13, 2019

(87) PCT Pub. No.: WO2019/076116
PCT Pub. Date: Apr. 25, 2019

(65) Prior Publication Data
US 2020/0160767 A1    May 21, 2020

(30) Foreign Application Priority Data

Oct. 16, 2017    (CN) .......................... 2017 1 0962615

(51) Int. Cl.
*G09G 3/00* (2006.01)
*G11C 19/28* (2006.01)
*G09G 3/20* (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2310/0267; G09G 2310/0283;
(Continued)

(56) References Cited

U.S. PATENT DOCUMENTS

| 7,212,183 B2 | 5/2007 | Tobita |
| 9,704,423 B2 * | 7/2017 | Xiao .......................... G09G 3/20 |

(Continued)

FOREIGN PATENT DOCUMENTS

| CN | 1517967 A | 8/2004 |
| CN | 102654986 A | 9/2012 |

(Continued)

OTHER PUBLICATIONS

International Search Report and Written Opinion, including English translation of the search report and Box V of the Written Opinion, for International Application No. PCT/CN2018/099941, dated Oct. 31, 2018, 15 pages.

(Continued)

*Primary Examiner* — Grant Sitta
(74) *Attorney, Agent, or Firm* — Westman, Champlin & Koehler, P.A.

(57) ABSTRACT

The present disclosure provides a gate driving circuit, a shift register, and a driving control method thereof. The shift register includes: a gate signal generation circuit configured to generate a first gate signal for gating transistors, wherein
(Continued)

the gating transistors comprise a first gating transistor and a second gating transistor coupled in series; a gate signal output control circuit configured to receive a first level signal, and output a first gate signal from the gate signal generation circuit to the first gating transistor and the second gating transistor under control of the first level signal; and a control circuit configured to receive a second level signal, a first control signal, and a second control signal, and output the first control signal to the first gating transistor and output the second control signal to the second gating transistor under control of the second level signal.

13 Claims, 9 Drawing Sheets

(52) U.S. Cl.
CPC .............. *G09G 2310/0267* (2013.01); *G09G 2310/0283* (2013.01); *G09G 2310/0286* (2013.01); *G09G 2310/08* (2013.01)

(58) Field of Classification Search
CPC ....... G09G 2310/0286; G09G 2310/08; G09G 2320/0214; G11C 19/28
See application file for complete search history.

(56) References Cited

U.S. PATENT DOCUMENTS

| | | | | |
|---|---|---|---|---|
| 9,990,897 | B2* | 6/2018 | Pang | G11C 19/287 |
| 10,217,428 | B2* | 2/2019 | Fan | G09G 3/3677 |
| 2004/0145551 | A1 | 7/2004 | Tobita | |
| 2009/0267871 | A1 | 10/2009 | Tanabe | |
| 2011/0216876 | A1* | 9/2011 | Amano | G09G 3/3677 |
| | | | | 377/75 |
| 2012/0113068 | A1* | 5/2012 | Chen | G11C 19/28 |
| | | | | 345/204 |
| 2012/0162170 | A1* | 6/2012 | Ochiai | G09G 5/003 |
| | | | | 345/208 |
| 2012/0182279 | A1* | 7/2012 | Ochiai | G09G 3/3677 |
| | | | | 345/209 |
| 2012/0212401 | A1* | 8/2012 | Bae | G09G 3/3648 |
| | | | | 345/88 |
| 2013/0077736 | A1* | 3/2013 | Son | G09G 3/2085 |
| | | | | 377/69 |
| 2013/0135284 | A1* | 5/2013 | Tseng | G11C 19/28 |
| | | | | 345/212 |
| 2014/0010341 | A1* | 1/2014 | Wu | G11C 19/00 |
| | | | | 377/78 |
| 2014/0086379 | A1 | 3/2014 | Ma et al. | |
| 2014/0159997 | A1* | 6/2014 | Chen | G09G 3/3611 |
| | | | | 345/87 |
| 2015/0185522 | A1* | 7/2015 | Xu | G02F 1/13306 |
| | | | | 327/108 |
| 2015/0206495 | A1* | 7/2015 | Xu | G09G 3/3677 |
| | | | | 345/213 |
| 2015/0269899 | A1* | 9/2015 | Ma | G09G 3/3674 |
| | | | | 345/213 |
| 2015/0302934 | A1* | 10/2015 | Qi | G11C 19/184 |
| | | | | 377/54 |
| 2016/0012764 | A1* | 1/2016 | Xu | G09G 3/3677 |
| | | | | 345/204 |
| 2016/0027526 | A1* | 1/2016 | Xu | G09G 3/2096 |
| | | | | 345/215 |
| 2016/0240158 | A1* | 8/2016 | Xu | G11C 19/28 |
| 2017/0039971 | A1* | 2/2017 | Huang | G11C 19/184 |
| 2017/0153742 | A1* | 6/2017 | Pang | G06F 3/0416 |
| 2017/0178581 | A1* | 6/2017 | Li | G09G 3/3655 |
| 2017/0186393 | A1* | 6/2017 | Wang | G11C 19/287 |
| 2017/0193957 | A1* | 7/2017 | Liu | G11C 19/28 |
| 2019/0013083 | A1 | 1/2019 | Wang et al. | |

FOREIGN PATENT DOCUMENTS

| | | |
|---|---|---|
| CN | 104795044 A | 7/2015 |
| CN | 105372893 A | 3/2016 |
| CN | 106128403 A | 11/2016 |
| CN | 106601204 A | 4/2017 |
| CN | 106920503 A | 7/2017 |
| CN | 107481659 A | 12/2017 |

OTHER PUBLICATIONS

First Office Action, including Search Report, for Chinese Patent Application No. 201710962615.6, dated Jul. 2, 2019, 9 pages.

* cited by examiner

GATE DRIVING CIRCUIT, SHIFT REGISTER AND DRIVING CONTROL METHOD THEREOF

CROSS-REFERENCE TO RELATED APPLICATION(S)

This application corresponds to the PCT application No. PCT/CN2018/099941, which claims priority to the Chinese Patent Application No. 201710962615.6, filed on Oct. 16, 2017, which are incorporated herein by reference in their entireties.

TECHNICAL FIELD

The present disclosure relates to the field of display technologies, and more particularly, to a shift register, a gate driving circuit, and a driving control method for a shift register.

BACKGROUND

Compared to conventional display products, intelligent wearable devices require display panels which are smaller in size, are shaped, and consume less power.

However, in order to achieve low power consumption, the intelligent wearable devices usually display at a low refresh frequency (for example, 1 Hz), and thereby electric leakage of gating transistors in pixel units is likely to occur.

SUMMARY

According to an aspect of the embodiments of the present disclosure, there is provided a shift register, comprising: a gate signal generation circuit configured to generate a first gate signal for gating transistors, wherein the gating transistors comprise a first gating transistor and a second gating transistor coupled in series; a gate signal output control circuit electrically coupled to the gate signal generation circuit and the gating transistors, and configured to receive a first level signal and output the first gate signal to the first gating transistor and the second gating transistor under control of the first level signal; and a control circuit configured to receive a second level signal, a first control signal, and a second control signal, and configured to output the first control signal to the first gating transistor and output the second control signal to the second gating transistor under control of the second level signal.

In an example, the gate signal output control circuit comprises a first transistor and a second transistor, wherein a control electrode of the first transistor and a control electrode of the second transistor are coupled to receive the first level signal, a first electrode of the first transistor and a first electrode of the second transistor are electrically coupled to the gate signal generation circuit, and a second electrode of the first transistor is electrically coupled to the gate of the first gating transistor; and a second electrode of the second transistor is electrically coupled to the control circuit.

In an example, the control circuit comprises a third transistor and a fourth transistor, wherein a control electrode of the third transistor and a control electrode of the fourth transistor are coupled to receive the second level signal, a first electrode of the third transistor is coupled to receive the first control signal, and a second electrode of the third transistor is electrically coupled to the gate of the first gating transistor; and a first electrode of the fourth transistor is coupled to receive the second control signal, and a second electrode of the fourth transistor is electrically coupled to the gate of the second gating transistor.

In an example, the gate signal generation circuit comprises: an input sub-circuit configured to receive an input signal and a reset signal, control a potential at a pull-up node under control of the input signal, and pull down the potential at the pull-up node under control of the reset signal; an output sub-circuit configured to receive a clock signal, and output the clock signal as the first gate signal under control of the potential at the pull-up node; a first pull-up sub-circuit configured to receive a third control signal, and control a potential at a pull-down node under control of the third control signal; and a first pull-down sub-circuit configured to pull down the potential at the pull-down node under control of the potential at the pull-up node, and pull down the potential at the pull-up node under control of the potential at the pull-down node.

In an example, the input sub-circuit comprises: a fifth transistor having a control electrode coupled to receive the input signal, and a first electrode coupled to receive the input signal or a forward scanning signal; and a sixth transistor having a control electrode coupled to receive the reset signal, a first electrode coupled to receive the reset signal or a reverse scanning signal, and a second electrode electrically coupled to a second electrode of the fifth transistor and the pull-up node.

In an example, the output sub-circuit comprises: a first capacitor having a first terminal electrically coupled to the pull-up node, and a second terminal electrically coupled to the gate signal output control circuit; and a seventh transistor having a control electrode electrically coupled to the pull-up node, a first electrode coupled to receive the clock signal, and a second electrode electrically coupled to the second terminal of the first capacitor.

In an example, the first pull-up sub-circuit comprises: an eighth transistor having a control electrode and a first electrode coupled to receive the third control signal; and a ninth transistor having a control electrode electrically coupled to a second electrode of the eighth transistor, a first electrode coupled to receive the third control signal, and a second electrode electrically coupled to the pull-down node.

In an example, the first pull-down sub-circuit comprises: a tenth transistor having a control electrode electrically coupled to the pull-down node, a first electrode electrically coupled to the pull-up node, and a second electrode electrically coupled to a low level voltage line; an eleventh transistor having a control electrode electrically coupled to the pull-up node, a first electrode electrically coupled to the second electrode of the eighth transistor, and a second electrode electrically coupled to the low level voltage line; and a twelfth transistor having a control electrode electrically coupled to the pull-up node, a first electrode electrically coupled to the pull-down node, and a second electrode electrically coupled to the low level voltage line.

In an example, the gate signal generation circuit further comprises: a second pull-down sub-circuit electrically coupled to the gating transistors and the pull-down node, and configured to pull down a voltage output to the gate of the first gating transistor and the gate of the second gating transistor under control of the potential at the pull-down node.

In an example, the second pull-down sub-circuit comprises a thirteenth transistor and a fourteenth transistor, wherein a control electrode of the thirteenth transistor and a control electrode of the fourteenth transistor are electrically coupled to the pull-down node, a first electrode of the thirteenth transistor is electrically coupled to a low level voltage line, and a second electrode electrically coupled to the gate signal output control circuit; and the fourteenth transistor has a first electrode electrically coupled to the low level voltage line, and a second electrode electrically coupled to the gate signal output control circuit.

According to another aspect of the embodiments of the present disclosure, there is provided a gate driving circuit, comprising the shift register according to the embodiments of the present disclosure.

According to yet another aspect of the embodiments of the present disclosure, there is provided a driving control method for the shift register, comprising: applying, in a first phase, a first gate signal to the first gating transistor and the second gating transistor to turn on the first gating transistor and the second gating transistor at the same time; and applying, in a second phase, a first control signal to the gate of the first gating transistor and applying a second control signal to the gate of the second gating transistor, to turn on the first gating transistor and the second gating transistor alternatively, wherein the first control signal and the second control signal are at an active level alternatively.

In an example, the second level signal is opposite in phase to the first level signal.

In an example, in the first phase, the first level signal and the second level signal are both direct current signals; and in the second phase, the first level signal and the second level signal are both alternating current signals.

In an example, in the first phase, the first level signal is at a high level; and in the second phase, when one of the first control signal and the second control signal is at an active level, the second level signal is at a high level.

BRIEF DESCRIPTION OF THE ACCOMPANYING DRAWINGS

FIG. 7 is an operating timing diagram of the shift register shown in FIG. 6a;

DETAILED DESCRIPTION

The embodiments of the present disclosure will be described in detail below, and examples of the embodiments are illustrated in the accompanying drawings, throughout which the same or similar reference signs are used to refer to the same or similar elements or elements having the same or similar functions. The embodiments described below with reference to the accompanying drawings are illustrative and are intended to explain the present disclosure, rather than being construed as limiting the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "coupled with" or "coupled electrically to" may mean that two components are directly coupled, or that two components are coupled via one or more other components. In addition, the two components may be connected or coupled by wire or wirelessly.

Further, in the description of the embodiments of the present disclosure, the terms "first level" and "second level" are only used to distinguish magnitudes of the two levels from each other.

A shift register, a gate driving circuit, and a driving control method for a shift register according to the embodiments of the present disclosure will be described below with reference to the accompanying drawings.

Figure 1:
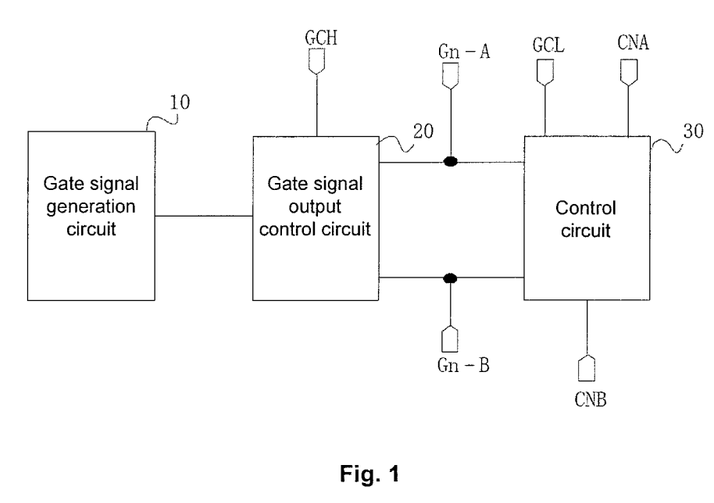
FIG. 1 is a block diagram of a shift register according to an embodiment of the present disclosure.

FIG. 1 is a block diagram of a shift register according to an embodiment of the present disclosure. As shown in FIG. 1, the shift register according to the embodiment of the present disclosure may comprise a gate signal generation circuit 10, a gate signal output control circuit 20, and a control circuit 30.

According to an embodiment of the present disclosure, the gate signal generation circuit 10 is configured to generate a first gate signal for gating transistors. The gating transistors may comprise a first gating transistor and a second gating transistor coupled in series. For example, the first gating transistor may be coupled in series to the second gating transistor. The gate signal generation circuit 10 is electrically coupled to the gate signal output control circuit 20.

The gate signal output control circuit 20 has a first level signal input terminal GCH. The gate signal output control circuit 20 is coupled to the gate signal generation circuit 10 and the driving transistors. The gate signal output control circuit 20 is configured to receive a first level signal, and output the first gate signal from the gate signal generation circuit 10 to the first gating transistor and the second gating transistor under control of the first level signal. For example, the first gate signal from the gate signal generation circuit 10 may be output to a gate Gn-A of the first gating transistor and a gate Gn-B of the second gating transistor.

The control circuit 30 has a second level signal input terminal GCL, a first control signal input terminal CNA, and a second control signal input terminal CNB. The control circuit 30 is configured to receive a second level signal, a first control signal and a second control signal, and output the first control signal to the first gating transistor and output the second control signal to the second gating transistor under control of the second level signal. For example, the first control signal may be output to the gate Gn-A of the first gating transistor, and the second control signal may be output to the gate Gn-B of the second gating transistor.

For one row of pixels, one gating transistor is usually provided. In a process of displaying one frame of picture, when a certain row of pixel circuits needs to be turned on, the first gate signal is directly output to gates of gating transistors of the row of pixel circuits, to turn on the gating transistors, and when the row of pixel circuits needs not to be turned on, the gating transistors are in a turn-off state. Since the gating transistors are in a turn-off state for a long time during one frame of display time, the gating transistors are in a negative bias voltage state for a long time due to negative biases such as high temperature, illumination, etc., and thus the problem of increased electric leakage of the gating transistors is likely to occur.

To this end, in the embodiments of the present disclosure, a single gating transistor in a pixel circuit is replaced with two gating transistors (which may be referred to as a dual-gate gating transistor) coupled in series, and in a process of displaying a picture, one frame of display time is divided into two phases which are a first phase and a second phase respectively. Here, in the first phase, the first gate signal is output progressively to gates of two gating transistors in each row of pixel circuits, so that the two gating transistors are turned on at the same time, that is, both of the gating transistors are completely turned on. This first phase may also be referred to as a "charging phase" due to the charging of the pixel circuits in the first phase. In the second phase, the first control signal and the second control signal are applied to the gates of the two gating transistors of each pixel circuit respectively at the same time, to turn on the two gating transistors sequentially, wherein the first control signal and the second control signal are at an active level alternately. Thereby, the problem of direct current bias voltage can be avoided. It is possible to alleviate the problem of increased electric leakage due to a long-term negative bias voltage of the gating transistors especially in a case of a low refresh rate. According to the embodiments of the present disclosure, the term "active level" refers to a level which enables a transistor to be turned on. For example, for an N-type transistor, the active level is a relatively high level, and for a P-type transistor, the active level is a relatively low level.

Figure 2A:
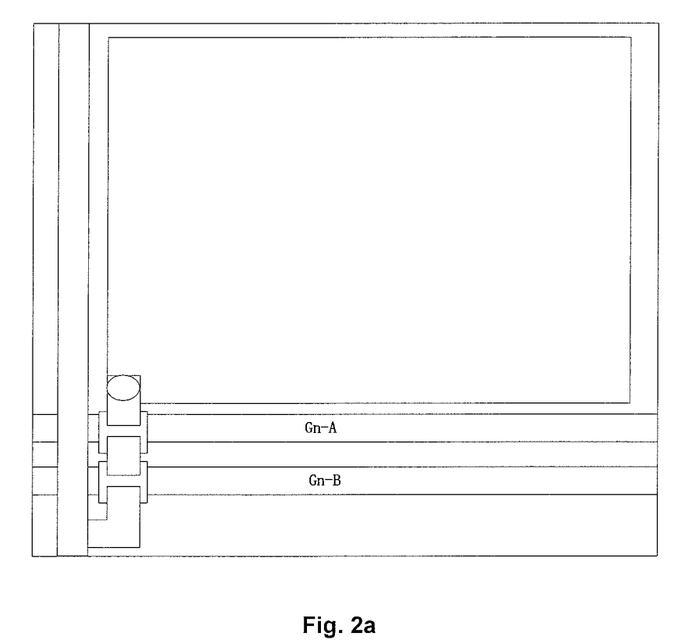
FIG. 2a is a structural diagram of a pixel circuit according to an embodiment of the present disclosure.
Figure 2B:
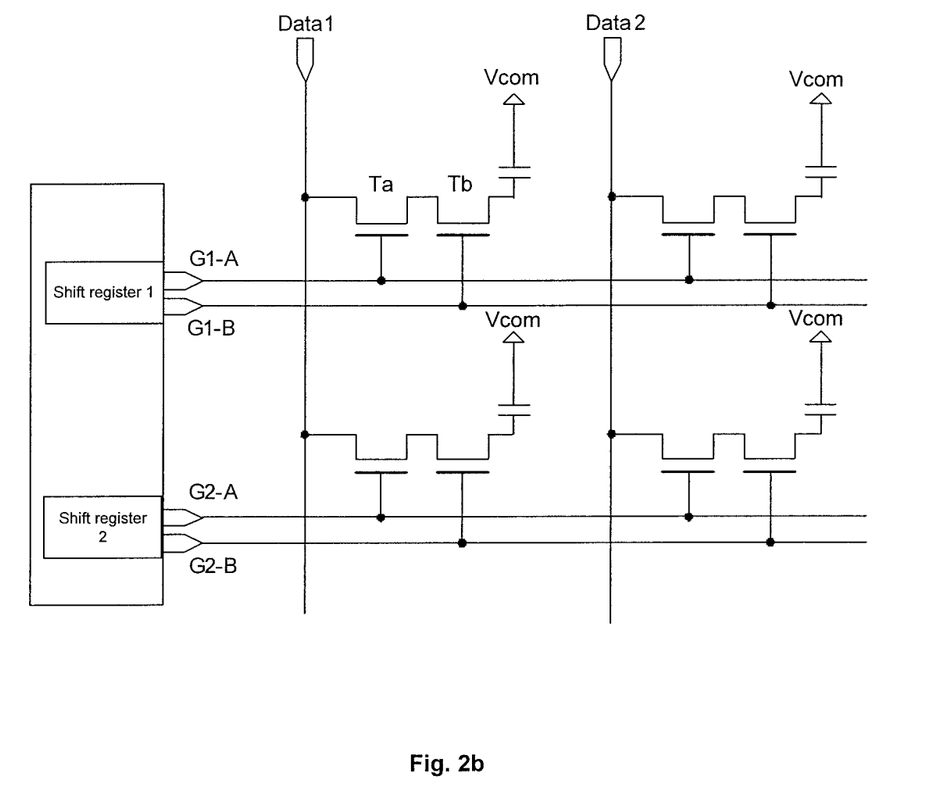
FIG. 2b is a structural diagram of a pixel circuit according to an example of the present disclosure.

FIG. 2a is a structural diagram of a pixel unit according to an embodiment of the present disclosure, and FIG. 2b is an internal structural diagram of a pixel circuit according to an example of the present disclosure. As shown in FIGS. 2a and 2b, according to the embodiments of the present disclosure, a first electrode of a first gating transistor Ta is electrically coupled to a data line Data1, a first electrode of a second gating transistor Tb is electrically coupled to a second electrode of the first gating transistor Ta, a second electrode of the second gating transistor Tb is electrically coupled to a common electrode Vcom, and a gate G1-A of the first gating transistor Ta and a gate G1-B of the second gating transistor Tb are electrically coupled to the gate signal output control circuit 20 of the shift register respectively.

Figure 3:
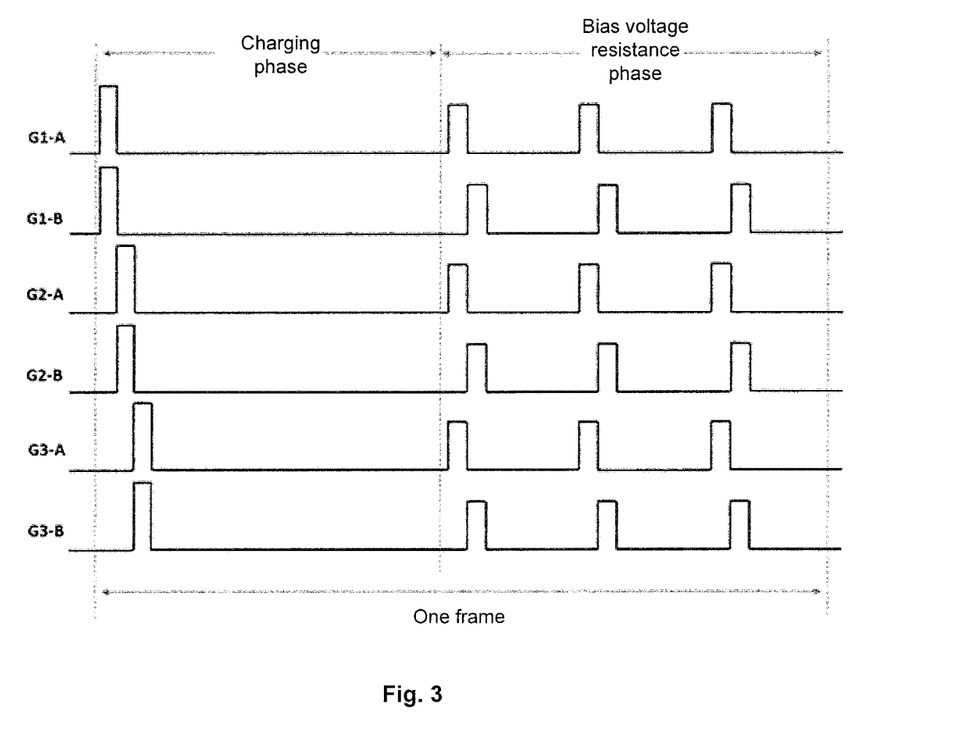
FIG. 3 is a waveform diagram of a gate signal for a gating transistor during one frame of display time according to an embodiment of the present disclosure.

FIG. 3 is a waveform diagram of a gate signal for a gating transistor during one frame of display time according to an embodiment of the present disclosure. As shown in FIG. 3, during one frame of display time (for example, 1 s, that is, a refresh frequency of 1 Hz), in a first phase, pixel units are progressively scanned, and the same gate signal, i.e., the first gate signal, is applied to two gating transistors of each pixel unit in one row of pixel units. Thereby, the two gating transistors are turned on at the same time, and the pixel unit is charged. In a second phase, the first control signal and the second control signal which are applied to the two gating transistors of each pixel unit in each row of pixel units at the same time are at an active level alternately, to turn on the two gating transistors alternately, thereby avoiding both of the gating transistors from being in a turn-off state for a long time.

For example, as shown in FIGS. 1, 2b, and 3, during one frame of display time, in the first phase, the pixel units are progressively scanned. When a gate signal generation circuit 10 corresponding to a first row of pixel units receives an input signal, the gate signal generation circuit 10 generates a first gate signal for gating transistors in the row of pixel units. Under control of the first level signal, the gate signal output control circuit 20 outputs the first gate signal from the gate signal generation circuit 10 to a gate Gn-A of each of first gating transistors and a gate Gn-B of each of second gating transistors in the first row of pixel units at the same time. That is, the first gate signal is output to the gate of each of the gating transistors in the first row of pixel units respectively. At this time, all the gating transistors in the first row of pixel units are completely turned on, and the row of pixel units is charged. A second row of pixel units is then scanned, . . . , until a last row of pixel units is scanned.

Then, the process proceeds to the second phase. In the second phase, the gate signal output control circuit 20 stops outputting under control of the first level signal. Both of the connection between the output terminal of the gate signal generation circuit 10 and the gate Gn-A of the first gating transistor and the connection between the output terminal of the gate signal generation circuit 10 and the gate Gn-B of the second gating transistor are not electrically conducted. The control circuit 30 outputs the first control signal and the second control signal which are at an active level alternately to the gate Gn-A of the first gating transistor and the gate Gn-B of the second gating transistor of each pixel unit in each row of pixel units under control of the second level signal, the first control signal, and the second control signal, so that the first gating transistor and the second gating transistor of each gating transistor in each row of pixel units are alternately turned on, thereby avoiding both of the gating transistors in the pixel unit from being in a turn-off state for a long time. It should be illustrated that, in the second phase, a control circuit 30 for a corresponding row of pixel units outputs the first control signal and the second control signal which are at an active level alternately to gates of two gating transistors in the corresponding row of pixel units, as shown in FIG. 3. The second phase may be referred to as a "bias voltage resistance phase".

As shown in FIG. 3, the first gate signal may be a low frequency signal, and the first control signal and the second control signal are high frequency signals. Here, a frequency of the low frequency signal is the same as a refresh frequency at which a picture is displayed. For example, when the refresh frequency is 1 Hz, the frequency of the low frequency signal is 1 Hz, and the high frequency signals have relatively high frequencies, which may be, for example, 10 Hz to 60 Hz.

Thereby, by configuring the gating transistors in the pixel unit as two gating transistors coupled in series, adding the second phase during one frame of display time, and controlling the two gating transistors to be continuously turned on alternatively in the second phase, the electric leakage of the gating transistors can be reduced.

The gate signal output control circuit 20 and the control circuit 30 will be further described below.

Figure 4:
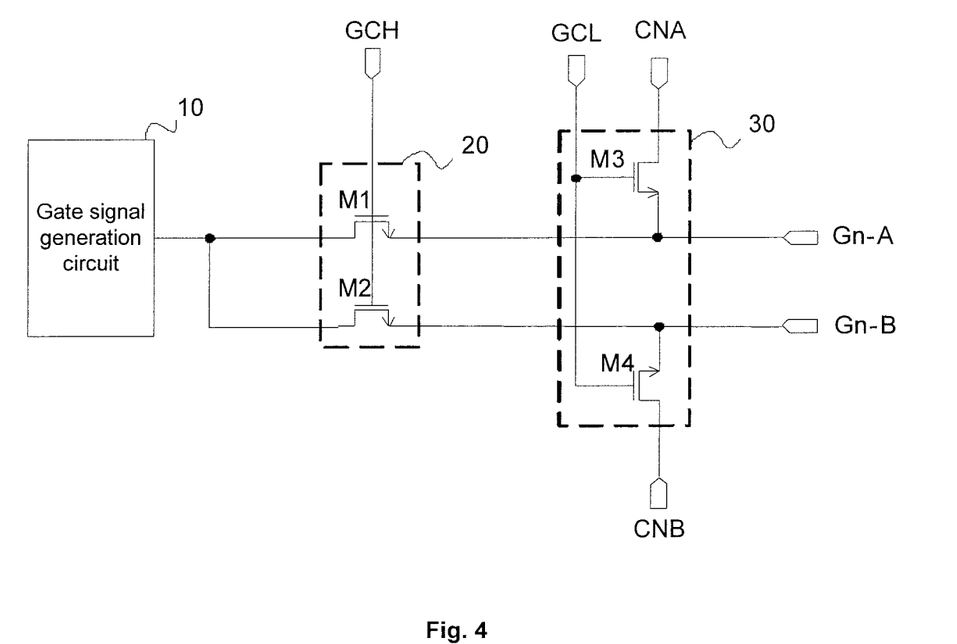
FIG. 4 is a structural diagram of a shift register according to an embodiment of the present disclosure.

FIG. 4 is a structural diagram of a shift register according to an embodiment of the present disclosure. As shown in FIG. 4, the gate signal output control circuit 20 according to the embodiment of the present disclosure may comprise a first transistor M1 and a second transistor M2. A control electrode of the first transistor M1 and a control electrode of the second transistor M2 are electrically coupled to the first level signal input terminal GCH, a first electrode of the first transistor M1 and a first electrode of the second transistor M2 are electrically coupled to the output terminal of the gate signal generation circuit 10, a second electrode of the first transistor M1 is electrically coupled to the gate Gn-A of the first gating transistor, and a second electrode of the second transistor M2 is electrically coupled to the gate Gn-B of the second gating transistor.

The control circuit 30 may comprise a third transistor M3 and a fourth transistor M4. A control electrode of the third transistor M3 and a control electrode of the fourth transistor M4 are electrically coupled to the second level signal input terminal GCL, a first electrode of the third transistor M3 is electrically coupled to the first control signal input terminal CNA, a second electrode of the third transistor M3 is electrically coupled to the gate Gn-A of the first gating transistor, a first electrode of the fourth transistor M4 is electrically coupled to the second control signal input terminal CNB, and a second electrode of the fourth transistor M4 is electrically coupled to the gate Gn-B of the second gating transistor.

Figure 5:
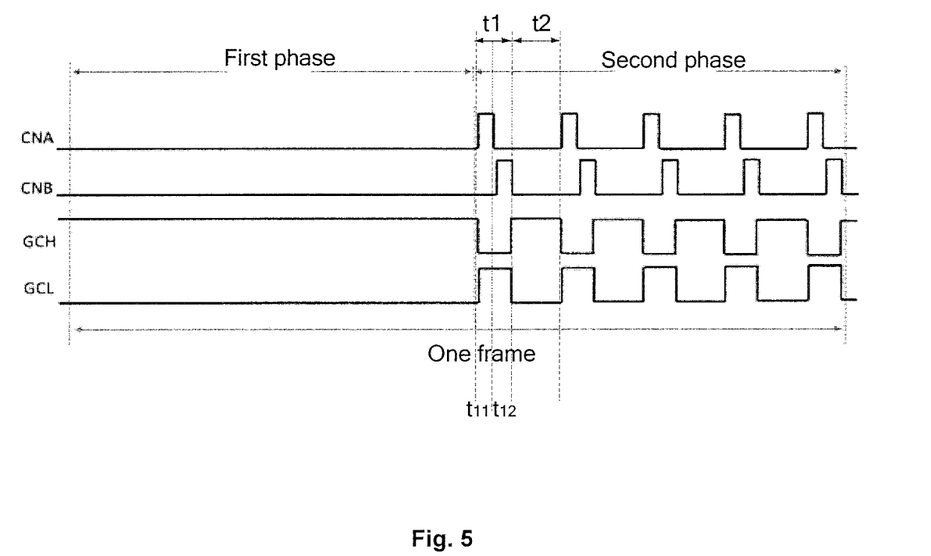
FIG. 5 is a waveform diagram of an input signal of a shift register during one frame of time according to an embodiment of the present disclosure.

FIG. 5 is a waveform diagram of an input signal of a shift register during one frame of time according to an embodiment of the present disclosure. As shown in FIG. 5, in the first phase, the first level signal GCH and the second level signal GCL are both direct current signals, and the first level signal is a high level signal. In the second phase, the first level signal and the second level signal are both alternating current signals, the first control signal and the second control signal are at an active level alternately, and when one of the first control signal CNA and the second control signal CNB is a high level signal, the second level signal is a high level signal.

As shown in FIGS. 3 to 5, in the first phase, the gate signal generation circuit 10 outputs the first gate signal, the first level signal input terminal GCH outputs a high level signal to the first transistor M1 and the second transistor M2, and the transistor M1 and the second transistor M2 are turned on. Thereby, the first gate signal output by the gate signal generation circuit 10 is input to the gate Gn-A of the first gating transistor and the gate Gn-B of the second gating transistor through the first transistor M1 and the second transistor M2. At this time, the first gating transistor and the second gating transistor are turned on at the same time, both of the gating transistors are completely turned on, and the pixel unit is charged. Since the first transistor M1 and the second transistor M2 are turned on at the same time, it is possible to output two gate signals which are exactly the same at the same time.

In the second phase, as shown in FIG. 5, firstly, in a period t1, the first level signal input terminal GCH outputs a low level signal to the first transistor M1 and the second transistor M2, so that the connection between the gate signal generation circuit 10 and the gate Gn-A of the first gating transistor and the connection between the gate signal generation circuit 10 and the gate Gn-B of the second gating transistor are not conducted electrically. At the same time, the second level signal input terminal GCL outputs a high level signal to the third transistor M3 and the fourth transistor M4, and the third transistor M3 and the fourth transistor M4 are turned on. The period t1 may be divided into a sub-period t11 and a sub-period t12. In the sub-period t11, the first control signal at the first control signal input terminal CNA is at, for example, a high level. Thereby, the high level is output to the gate Gn-A of the first gating transistor. Therefore, the first gating transistor is turned on. At the same time, the second control signal at the second control signal input terminal CNB is at, for example, a low level. Thereby, the low level is output to the gate Gn-B of the second gating transistor. Therefore, the second gating transistor is turned off. Then, in the sub-period t12, the second control signal at the second control signal input terminal CNB is at, for example, a high level. Thereby, the high level is output to the gate Gn-B of the second gating transistor. Therefore, the second gating transistor is turned on. The first control signal at the first control signal input terminal CNA is at, for example, a low level. Thereby, the low level is output to the gate Gn-A of the first gating transistor. Therefore, the first gating transistor is turned off.

Then, in a period t2, the first level signal input terminal GCH outputs a high level signal to the first transistor M1 and the second transistor M2, to electrically conduct the connection between the gate signal generation circuit 10 and the gate Gn-A of the first gating transistor and the connection between the gate signal generation circuit 10 and the gate Gn-B of the second gating transistor again. At the same time, the second level signal input terminal GCL outputs a low level signal to the third transistor M3 and the fourth transistor M4, to turn off the third transistor M3 and the fourth transistor M4. During this period, there is no signal output from the gate signal generation circuit 10. Therefore, the gate Gn-A of the first gating transistor and the gate Gn-B of the second gating transistor are both at a low level, and the first gating transistor and the second gating transistor are both turned off. After a period of time, the first gating transistor and the second gating transistor are controlled by the first level signal and the second level signal to be turned on again, . . . , and so on.

The gate signal output control circuit and the control circuit according to the embodiments of the present disclosure have relatively simple structures, occupy small spaces, and can guarantee ultra-low power consumption requirements for small-sized wearable devices (for example, bracelets) which often have high power consumption requirements.

The gate signal generation circuit 10 will be further described below.

Figure 6A:
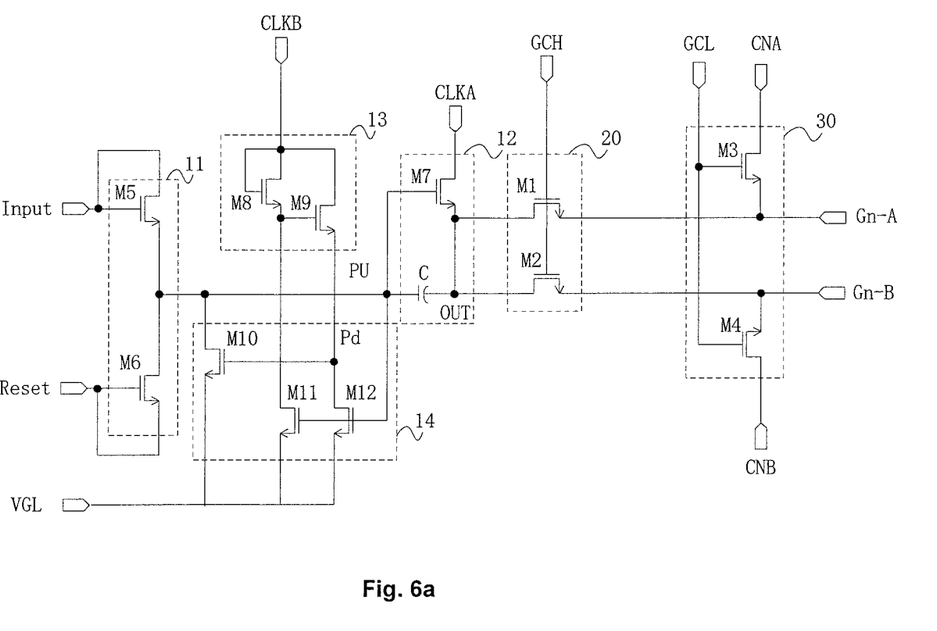
FIG. 6a is a structural diagram of a shift register according to another embodiment of the present disclosure.

FIG. 6a is a structural diagram of a shift register according to another embodiment of the present disclosure. As shown in FIG. 6a, the gate signal generation circuit 10 may comprise an input sub-circuit 11, an output sub-circuit 12, a first pull-up sub-circuit 13 and a first pull-down sub-circuit 14. The input sub-circuit 11 is configured to control a potential at a pull-up node PU under control of an input signal provided at the input terminal Input, and control the potential at the pull-up node PU under control of a reset signal provided at the reset terminal Reset. The output sub-circuit 12 is configured to output a clock signal provided at a clock signal terminal as the first gate signal under control of the potential at the pull-up node PU. The first pull-up sub-circuit 13 is configured to control a potential at a pull-down node Pd under control of a third control signal provided at a third control signal terminal CLKB. The first pull-down sub-circuit 14 is configured to pull down the potential at the pull-down node Pd under control of the potential at the pull-up node PU, and pull down the potential at the pull-up node PU under control of the potential at the pull-down node Pd.

Here, "pull-up" refers to raising a level at a corresponding circuit node, and "pull-down" refers to lowering a level at a corresponding circuit node.

As shown in FIG. 6a, when the pull-up node PU and the output terminal OUTPUT of the gate signal generation circuit 10 are required to be at a low level, the first pull-up sub-circuit 13 periodically pulls up the potential at the pull-down node Pd by using the third control signal at the third control signal terminal CLKB, so that the pull-down node Pd is at a high level. Thereby, the first pull-down sub-circuit 14 may pull down the potential at the pull-up node PU when the pull-down node Pd is at a high level, so that the pull-up node PU remains at a low level all the time.

When the input terminal Input receives a row scanning signal as the input signal, the input sub-circuit 11 pulls up the potential at the pull-up node PU. At this time, the output sub-circuit 12 may output a clock signal CLKA under control of a high level at the pull-up node PU, so that the signal output at the output terminal OUTPUT is at a high level. Thereby, the output terminal OUTPUT outputs the first gate signal for the gating transistors.

When the reset terminal Reset receives the reset signal, the input sub-circuit 11 pulls down the potential at the pull-up node PU. At this time, the first pull-up sub-circuit 13 and the first pull-down sub-circuit 14 pull down the potential at the pull-up node PU, so that the potential at the pull-up node PU remains at a low level.

Figure 6B:
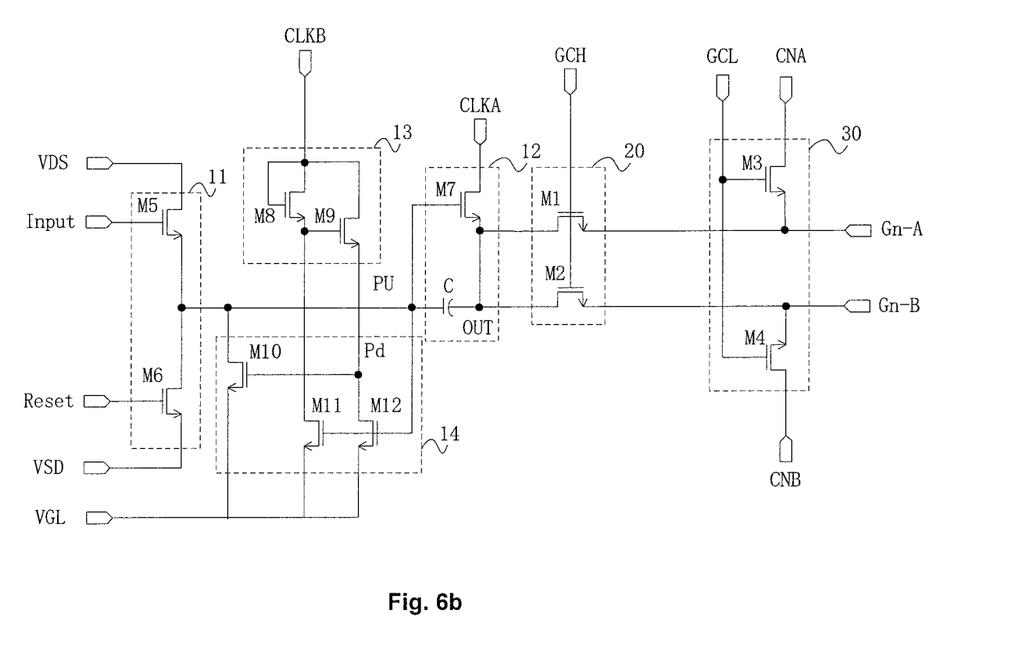
FIG. 6b is a structural diagram of a shift register according to still another embodiment of the present disclosure.

As shown in FIGS. 6a and 6b, the input sub-circuit 11 may comprise a fifth transistor M5 and a sixth transistor M6. The fifth transistor M5 has a control electrode electrically coupled to the input terminal Input, and a first electrode electrically coupled to the input terminal Input or a forward scanning signal input terminal VDS. The sixth transistor M6 has a control electrode electrically coupled to the reset terminal Reset, a first electrode electrically coupled to the reset terminal Reset or a reverse scanning signal input terminal VSD, and a second electrode electrically coupled to a second electrode of the fifth transistor M5 and then electrically coupled to the pull-up node PU.

As shown in FIG. 6a, when the input terminal Input receives the input signal, the fifth transistor M5 is turned on under control of a high level of the input signal. At this time, the potential at the pull-up node PU is pulled up to a high level. When the reset terminal Reset receives the reset signal, the sixth transistor M6 is turned on under control of a high level of the reset signal. At this time, the potential at the pull-up node PU is pulled down to a low level. Thereby, with the fifth transistor M5 and the sixth transistor M6, the potential at the pull-up node PU may be generated under control of the input signal provided at the input terminal Input, and the potential at the pull-up node PU is pulled down under control of the reset signal provided at the reset terminal Reset.

As shown in FIG. 6b, when the first electrode of the fifth transistor M5 is electrically coupled to the forward scanning signal input terminal VDS, and at the same time, the first electrode of the sixth transistor M6 is electrically coupled to the reverse scanning signal input terminal VSD, forward scanning and reverse scanning of the pixel circuit may be realized. Here, when the forward scanning signal input terminal VDS receives an active level, for example, a high level, and the reverse scanning signal input terminal VSD receives an opposite level, forward scanning of the pixel circuit is realized. When the reverse scanning signal input terminal VSD receives an active level, for example, a high level, and the forward scanning signal input terminal VDS receives an opposite level, reverse scanning of the pixel circuit is realized.

As shown in FIGS. 6a and 6b, the output sub-circuit 12 may comprise a first capacitor C and a seventh transistor M7. The first capacitor C has a first terminal electrically coupled to the pull-up node PU, and a second terminal electrically coupled to the gate signal output control circuit 20, as the output terminal OUTPUT of the gate signal generation circuit 10. The seventh transistor M7 has a control electrode electrically coupled to the pull-up node PU, a first electrode electrically coupled to the clock signal terminal CLKA, and a second electrode electrically coupled to the second terminal of the first capacitor C.

When a certain amount of charges is stored in a state where the pull-up node PU is at a high level and a potential difference exists across the first capacitor C, the potential at the clock signal terminal CLKA is switched from a low level to a high level. Thereby, the potential at the output terminal OUTPUT is pulled up by current from the clock signal terminal CLKA. Further, the potential at the pull-up node PU may further be raised under control of the first capacitor C, which speeds up pull-up of the output terminal OUTPUT, thereby achieving the output of the first gate signal for the gating transistors.

As shown in FIGS. 6a and 6b, the first pull-up sub-circuit 13 may comprise an eighth transistor M8 and a ninth transistor M9. The eighth transistor M8 has a control electrode electrically coupled to a first electrode of the eighth transistor M8 and the third control signal terminal CLKB. The ninth transistor M9 has a control electrode electrically coupled to a second electrode of the eighth transistor M8, a first electrode electrically coupled to the third control signal terminal CLKB, and a second electrode electrically coupled to the pull-down node Pd.

The first pull-down sub-circuit 14 may comprise a tenth transistor M10, an eleventh transistor M11, and a twelfth transistor M12. The tenth transistor M10 has a control electrode electrically coupled to the pull-down node Pd, a first electrode electrically coupled to the pull-up node PU, and a second electrode electrically coupled to a low level voltage line VGL. The eleventh transistor M11 has a control electrode electrically coupled to the pull-up node PU, a first electrode electrically coupled to the second electrode of the eighth transistor M8, and a second electrode electrically coupled to the low level voltage line VGL. The twelfth transistor M12 has a control electrode electrically coupled to the pull-up node PU, a first electrode electrically coupled to the pull-down node Pd, and a second electrode electrically coupled to the low level voltage line VGL.

When the third control signal terminal CLKB is at an active level, for example, a high level, the eighth transistor M8 and the ninth transistor M9 are both turned on. At this time, the pull-down node Pd is pulled up to a high level. When the third control signal terminal CLKB is at a low level, the eighth transistor M8 and the ninth transistor M9 are turned off, thereby interrupting pull-up of the pull-down node Pd. As the third control signal terminal CLKB is switched between a high level and a low level, periodic pull-up of the potential at the pull-down node Pd may be realized. When the pull-down node Pd is at a high level, the tenth transistor M10 is turned on, and the pull-up node PU is pulled down to a low level under control of the low level voltage line VGL. In addition, when the pull-up node PU is at a high level, the eleventh transistor M11 and the twelfth transistor M12 are both turned on. At this time, the pull-down node Pd is pulled down to a low level and the control electrode of the ninth transistor M9 is pulled down to a low level under control of the low level voltage line VGL. Thereby, pull-up and pull-down functions at various circuit nodes are realized.

Figure 7:
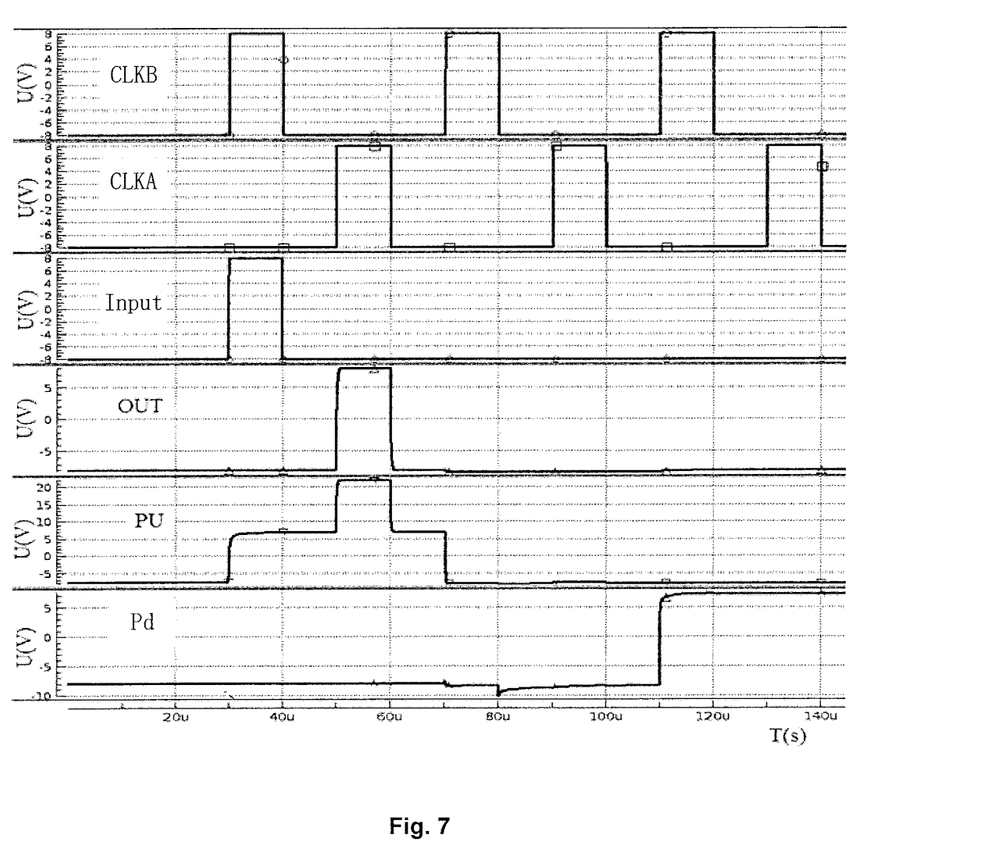

FIG. 7 is a timing diagram of the gate signal generation circuit shown in FIG. 6*a*. In addition, it should be illustrated that a circuit structure of the gate signal generation circuit shown in FIGS. 6*a* and 6*b* is only a specific example of the present disclosure, and other circuit structures may further be used in the embodiments of the present disclosure. That is, the gate signal output control circuit and the control circuit according to the present disclosure may be used in various shift registers. It is also possible to realize simple variations of the gate signal output control circuit and the control circuit, as long as two first gate signals which are the same are output in the first phase and a first control signal and a second control signal which are at an active level alternatively are output in the second phase.

Figure 8:
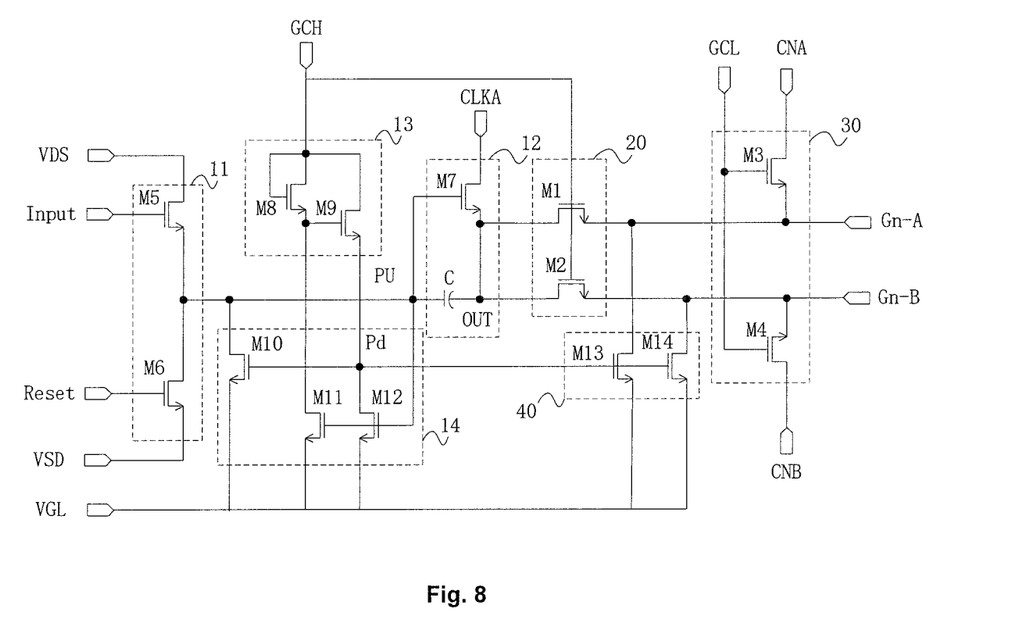
FIG. 8 is a structural diagram of a shift register according to still another embodiment of the present disclosure.
Figure 9:
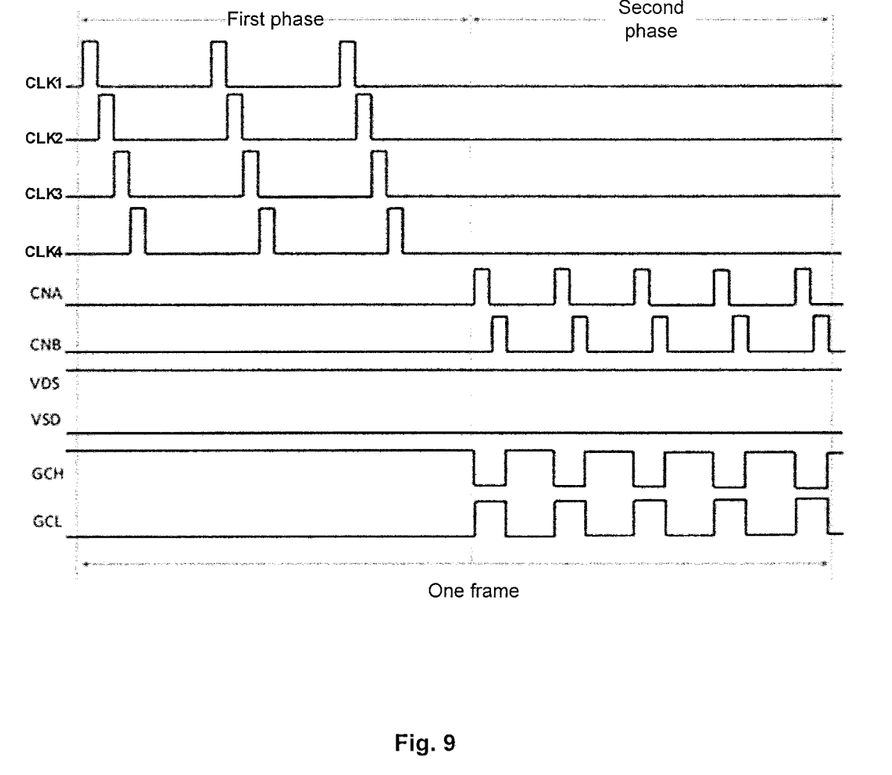
FIG. 9 is an exemplary operating timing diagram of the shift register shown in FIG. 8.

FIG. 8 is a structural diagram of a shift register according to still another embodiment of the present disclosure, and FIG. 9 is an operating timing diagram of the shift register shown in FIG. 8. As shown in FIG. 8, the shift register may further comprise a second pull-down sub-circuit 40 electrically coupled to the gating transistors and the pull-down node Pd, and configured to pull down a voltage output to the gate Gn-A of the first gating transistor and the gate Gn-B of the second gating transistor under control of the potential at the pull-down node Pd.

As shown in FIG. 8, the second pull-down sub-circuit 40 may further comprise a thirteenth transistor M13 and a fourteenth transistor M14. A control electrode of the thirteenth transistor M13 and a control electrode of the fourteenth transistor M14 are electrically coupled to the pull-down node Pd, and a first electrode of the thirteenth transistor M13 is electrically coupled to the gate Gn-A of the first gating transistor. A first electrode of the fourteenth transistor M14 is electrically coupled to the gate Gn-B of the second gating transistor, and a second electrode of the thirteenth transistor M13 and a second electrode of the fourteenth transistor M14 are electrically coupled to the low level voltage line VGL respectively.

When the pull-down node Pd is at a high level, the thirteenth transistor M13 and the fourteenth transistor M14 are turned on. At this time, the gate Gn-A of the first gating transistor and the gate Gn-B of the second gating transistor remain at a low level all the time under control of the low level voltage line VGL.

Further, as shown in FIG. 8, the third control signal terminal is electrically coupled to the first level signal input terminal GCH, so as to reduce the use of the signal line.

FIG. 9 is a timing diagram of the shift register shown in FIG. 8. As shown in FIGS. 8 and 9, when the forward scanning signal input terminal VDS is at a high level and the reverse scanning signal input terminal VSD is at a low level, forward scanning is realized. A clock signal CLK1 in FIG. 9 may be applied to the clock signal terminal CLKA of the shift register shown in FIG. 8, and clock signals CLK2 to CLK4 may be sequentially applied to clock signal terminals CLKA of other shift registers cascaded with the shift register shown in FIG. 8 respectively.

In a process of forward scanning, during one frame of display time, in the first phase, the gate signal generation circuit 10 outputs the first gate signal according to the input signal. Since the first level signal GCH is at a high level and the second level signal GCL is at a low level, the first transistor M1 and the second transistor M2 are turned on. At this time, the first gate signal is output to the gate Gn-A of the first gating transistor and the gate Gn-B of the second gating transistor through the first transistor M1 and the second transistor M2 respectively, so that the first gating transistor and the second gating transistor are turned on at the same time, both of the gating transistors are completely turned on, and the pixel unit is charged.

In the second phase, as described above with reference to FIG. 5, the output terminal OUTPUT of the gate signal generation circuit 10 is at a low level. At this time, the first level signal GCH and the second level signal GCL are alternating current signals, and the first control signal CNA and the second control signal CNB are signals which are at an active level alternatively. Therefore, when the second level signal GCL is at a high level and the first level signal GCH is at a low level, and the first control signal CNA is at a high level and the second control signal CNB is at a low level, the first gating transistor is turned on. When the second level signal GCL is at a high level and the first level signal GCH is at a low level, and the second control signal CNB is at a high level and the second control signal CNA is at a low level, the second gating transistor is turned on. In such an alternating way, the first gating transistor and the second gating transistor are turned on alternately to effectively reduce the problem of electric leakage caused by the gating transistors being in a negative bias voltage state for a long time.

In summary, according to the shift register of the embodiments of the present disclosure, the first gate signal for the gating transistors is generated by the gate signal generation circuit, wherein the gating transistors comprise a first gating transistor and a second gating transistor coupled in series. The gate signal output control circuit outputs the first gate signal to the first gating transistor and the second gating transistor under control of the first level signal. Further, the control circuit outputs the first control signal to the first gating transistor and outputs the second control signal to the second gating transistor under control of the second level signal. The shift register can effectively reduce the electric leakage of the gating transistors.

In addition, the embodiments of the present disclosure further provide a gate driving circuit comprising a plurality of cascaded shift registers as described above.

Figure 10:
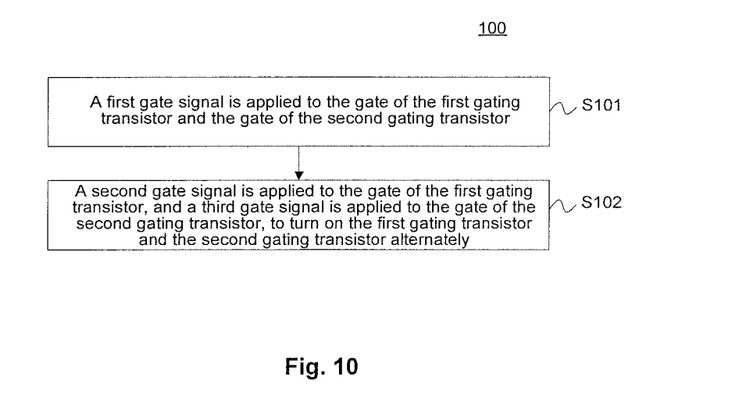
FIG. 10 is a flowchart of a driving control method for a pixel circuit according to an embodiment of the present disclosure.

FIG. 10 is a flowchart of a driving control method for a shift register according to an embodiment of the present disclosure. A specific structure of the shift register has been described in detail above and will not be described again here. As shown in FIG. 10, the driving control method 100 for the shift register according to the embodiment of the present disclosure may comprise the following steps.

In step S101, a first gate signal is applied to the gate of the first gating transistor and the gate of the second gating transistor, to turn on the first gating transistor and the second gating transistor at the same time.

In step S102, a first control signal is applied to the gate of the first gating transistor, and a second control signal is applied to the gate of the second gating transistor, to turn on the first gating transistor and the second gating transistor alternately, wherein the first control signal and the second control signal are at an active level alternately.

In the embodiment of the present disclosure, in a process of displaying a picture, one frame of display time is divided into two phases which are a first phase and a second phase respectively. Here, in the first phase, the first gate signal is output to the gates of the two gating transistors, that is, the same gate signal is applied to the gates of the two gating transistors, so that the two gating transistors are turned on at the same time, both of the gating transistors are completely turned on, and the pixel unit is charged. In the second phase, the first control signal and the second control signal which are at an active level (for example, a high level) alternately are applied to the gates of the two gating transistors respectively, to turn on the two gating transistors alternately. Thereby, the problem of direct current bias voltage can be avoided. It is possible to alleviate the increased electric leakage due to a long-term negative bias voltage of the gating transistors especially in a case of a low refresh frequency.

According to an embodiment of the present disclosure, the second level signal is opposite in phase to the first level signal.

In the first phase, the first level signal and the second level signal are both direct current signals; and in the second phase, the first level signal and the second level signal are both alternating current signals.

Further, in the first phase, the first level signal is a high level signal. In the second phase, when one of the first control signal and the second control signal is at an active level, the second level signal is a high level signal.

The shift register shown in FIG. 4 is taken as an example. As shown in FIGS. 3 to 5, in the first phase, the gate signal generation circuit 10 outputs a first gate signal according to the input signal, and the first level signal input terminal GCH outputs a first level signal at a high level to the first transistor M1 and the second transistor M2, so that the first transistor M1 and the second transistor M2 are turned on. The first gate signal output by the gate signal generation circuit 10 is input to the gate Gn-A of the first gating transistor and the gate Gn-B of the second gating transistor through the first transistor M1 and the second transistor M2 respectively. At this time, the first gating transistor and the second gating transistor are turned on at the same time, both of the gating transistors are completely turned on, and the pixel unit is charged. Since the first transistor and the second transistor are turned on at the same time, it is possible to output two gate signals having exactly the same timing at the same time.

In the second phase, the first level signal input terminal GCH outputs a first level signal at a low level to the first transistor M1 and the second transistor M2, so that the connection between the gate signal generation circuit 10 and the gate Gn-A of the first gating transistor and the connection between the gate signal generation circuit 10 and the gate Gn-B of the second gating transistor are not electrically conducted. The second level signal input terminal GCL outputs a second level signal at a high level to the third transistor M3 and the fourth transistor M4, and the third transistor M3 and the fourth transistor M4 are turned on. During a period in which the third transistor M3 and the fourth transistor M4 are turned on, firstly, the first control signal at a high level is output to the gate Gn-A of the first gating transistor, and the first gating transistor is turned on. At the same time, the second control signal at a low level is output to the gate Gn-B of the second gating transistor, and the second gating transistor is turned off. Then, the second control signal at a high level is output to the gate Gn-B of the second gating transistor, and the second gating transistor is turned on. At the same time, the first control signal at a low level is output to the gate Gn-A of the first gating transistor, and the first gating transistor is turned off. After a period of time, the first gating transistor is controlled to be turned on again, . . . , and so on.

In addition, it should be illustrated that, details not disclosed in the driving control method for the shift register according to the embodiment of the present disclosure can be known with reference to the details disclosed in the shift register according to the embodiments of the present disclosure, and will not be described again here.

Although the embodiments of the present disclosure have been illustrated and described above, it can be understood that the embodiments described above are illustrative and are not to be construed as limiting the present disclosure. Variations, modifications, substitutions and variations of the embodiments described above may be made by those of ordinary skill in the art within the scope of the present disclosure.

We claim:

1. A shift register, comprising:
    a gate signal generation circuit configured to generate a first gate signal for gating transistors, wherein the gating transistors comprise a first gating transistor and a second gating transistor coupled in series;
    a gate signal output control circuit electrically coupled to the gate signal generation circuit and the gating transistors, and configured to receive a first level signal and output the first gate signal to the first gating transistor and the second gating transistor under control of the first level signal; and
    a control circuit configured to receive a second level signal, a first control signal, and a second control signal, and configured to output the first control signal to the first gating transistor and output the second control signal to the second gating transistor under control of the second level signal;
    wherein the gate signal generation circuit comprises:
    an input sub-circuit configured to receive an input signal and a reset signal, control a potential at a pull-up node under control of the input signal, and pull down the potential at the pull-up node under control of the reset signal;
    an output sub-circuit configured to receive a clock signal, and output the clock signal as the first gate signal under control of the potential at the pull-up node;
    a first pull-up sub-circuit configured to receive a third control signal, and control as potential at a pull-down node under control of the third control signal;
    a first pull-down sub-circuit configured to pull-down the potential at the pull-down node under control of the potential at the pull-up node, and pull down the potential at the pull-up node under control of the potential at the pull-down node; and
    a second pull-down sub-circuit electrically coupled to the gating transistors and the pull-down node, and configured to pull down a voltage output to the gate of the first gating transistor and the gate of the second gating transistor under control of the potential at the pull-down node.

2. The shift register according to claim 1, wherein the gate signal output control circuit comprises a first transistor and a second transistor,
    wherein a control electrode of the first transistor and a control electrode of the second transistor are coupled to receive the first level signal, a first electrode of the first transistor and a first electrode of the second transistor are electrically coupled to the gate signal generation circuit, and a second electrode of the first transistor is electrically coupled to the gate of the first gating transistor; and
    a second electrode of the second transistor is electrically coupled to the control circuit.

3. The shift register according to claim 1, wherein the control circuit comprises a third transistor and a fourth transistor,
    wherein a control electrode of the third transistor and a control electrode of the fourth transistor are coupled to receive the second level signal, a first electrode of the third transistor is coupled to receive the first control signal, and a second electrode of the third transistor is electrically coupled to the gate of the first gating transistor; and a first electrode of the fourth transistor is coupled to receive the second control signal, and a second electrode of the fourth transistor is electrically coupled to the gate of the second gating transistor.

4. The shift register according to claim 1, wherein the input sub-circuit comprises:

a fifth transistor having a control electrode coupled to receive the input signal, and a first electrode coupled to receive the input signal or a forward scanning signal; and a sixth transistor having a control electrode coupled to receive the reset signal, a first electrode coupled to receive the reset signal or a reverse scanning signal, and a second electrode electrically coupled to a second electrode of the fifth transistor and the pull-up node.

5. The shift register according to claim 1, wherein the output sub-circuit comprises:

a first capacitor having a first terminal electrically coupled to the pull-up node, and a second terminal electrically coupled to the gate signal output control circuit; and a seventh transistor having a control electrode electrically coupled to the pull-up node, a first electrode coupled to receive the clock signal, and a second electrode electrically coupled to the second terminal of the first capacitor.

6. The shift register according to claim 1, wherein the first pull-up sub-circuit comprises:

an eighth transistor having a control electrode and a first electrode coupled to receive the third control signal; and a ninth transistor having a control electrode electrically coupled to a second electrode of the eighth transistor, a first electrode coupled to receive the third control signal, and a second electrode electrically coupled to the pull-down node.

7. The shift register according to claim 6, wherein the first pull-down sub-circuit comprises:

a tenth transistor having a control electrode electrically coupled to the pull-down node, a first electrode electrically coupled to the pull-up node, and a second electrode electrically coupled to a low level voltage line;

an eleventh transistor having a control electrode electrically coupled to the pull-up node, a first electrode electrically coupled to the second electrode of the eighth transistor, and a second electrode electrically coupled to the low level voltage line; and a twelfth transistor having a control electrode electrically coupled to the pull-up node, a first electrode electrically coupled to the pull-down node, and a second electrode electrically coupled to the low level voltage line.

8. The shift register according to claim 1, wherein the second pull-down sub-circuit comprises a thirteenth transistor and a fourteenth transistor, wherein a control electrode of the thirteenth transistor and a control electrode of the fourteenth transistor are electrically coupled to the pull-down node, a first electrode of the thirteenth transistor is electrically coupled to a low level voltage line, and a second electrode electrically coupled to the gate signal output control circuit; and the fourteenth transistor has a first electrode electrically coupled to the low level voltage line, and a second electrode electrically coupled to the gate signal output control circuit.

9. A gate driving circuit, comprising the shift register according to claim 1.

10. A driving control method for the shift register according to claim 1, comprising:

applying, in a first phase, a first gate signal to the first gating transistor and the second gating transistor to turn on the first gating transistor and the second gating transistor at the same time; and applying, in a second phase, a first control signal to the gate of the first gating transistor and applying a second control signal to the gate of the second gating transistor, to turn on the first gating transistor and the second gating transistor alternatively, wherein the first control signal and the second control signal are at an active level alternatively.

11. The driving control method according to claim 10, wherein the second level signal is opposite in phase to the first level signal.

12. The driving control method according to claim 11, wherein in the first phase, the first level signal and the second level signal are both direct current signals; and in the second phase, the first level signal and the second level signal are both alternating current signals.

13. The driving control method according to claim 12, wherein in the first phase, the first level signal is at a high level; and in the second phase, when one of the first control signal and the second control signal is at an active level, the second level signal is at a high level.

* * * * *